US008680945B1

(12) United States Patent
Wang

(10) Patent No.: US 8,680,945 B1
(45) Date of Patent: Mar. 25, 2014

(54) METAMATERIAL ENABLED COMPACT WIDEBAND TUNABLE PHASE SHIFTERS

(75) Inventor: Leah Wang, Fremont, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 509 days.

(21) Appl. No.: 13/014,678

(22) Filed: Jan. 26, 2011

Related U.S. Application Data

(60) Provisional application No. 61/305,498, filed on Feb. 17, 2010.

(51) Int. Cl.
*H03H 7/20* (2006.01)
*H03H 7/01* (2006.01)

(52) U.S. Cl.
USPC .......................................... 333/139; 333/175

(58) Field of Classification Search
USPC .................... 333/138, 139, 174, 175
See application file for complete search history.

(56) References Cited

U.S. PATENT DOCUMENTS

| 7,593,696 B2 * | 9/2009 | Fischer ............................ 455/87 |
| 7,839,236 B2 * | 11/2010 | Dupuy et al. ................... 333/136 |
| 8,237,519 B2 * | 8/2012 | Achour ........................... 333/172 |

OTHER PUBLICATIONS

Abdalla, Mohammed A.Y., et al., A Tunable Metamaterial Phase-Shifter Structur Base on a 0.13um CMOS Active Inductor, Sep. 2006, IEEE Xplore, 4 pages.*

* cited by examiner

*Primary Examiner* — Dean O Takaoka

(74) *Attorney, Agent, or Firm* — McDermott Will & Emery LLP

(57) ABSTRACT

Negative refractive index (NRI) transmission line (TL) metamaterial may be applied to phase shifter devices. In some aspects, a one dimensional NRI TL enabled compact and tunable phase shifter is provided. The phase shifter comprises cascaded sections of NRI metamaterial TL and positive refraction index TL with tailored dispersion characteristics. The phase shifter, for example as compared to common delay line based or ferrite based phase shifters, may be compact in size, may be continuously tunable from negative to positive phases, may have flatter and more linear phase responses over wideband, may have small group delays, and may be compatible to microwave circuits.

20 Claims, 4 Drawing Sheets

METAMATERIAL ENABLED COMPACT WIDEBAND TUNABLE PHASE SHIFTERS

CROSS-REFERENCE TO RELATED APPLICATIONS

The present application claims the benefit of priority under 35 U.S.C. §119 from U.S. Provisional Patent Application Ser. No. 61/305,498, entitled "METAMATERIAL ENABLED COMPACT WIDEBAND TUNABLE PHASE SHIFTERS," filed on Feb. 17, 2010, which is hereby incorporated by reference in its entirety for all purposes.

FIELD

An aspect of the present disclosure may relates to the field of microwave circuits or components, and more particularly, to a metamaterial enabled compact wideband tunable phase shifter.

BACKGROUND

As microwave circuits become more compact and agile, microwave components having low profiles, integration compatibility, tunable characteristics, and low losses are desirable. Metamaterials possess unique properties not existent in nature, such as negative refractive index (NRI), left-handed triplet material (LHM), and backward traveling waves. Metamaterial may help realize microwave components with unprecedented functionalities. Various types of artificial composite metamaterial media may be applied in microwave electronics and radio frequencies (RF). Some metamaterial configurations include wire strips and split-ring resonators. The size of such components, however, may prohibit their practical implementation in planar microwave circuits.

SUMMARY

In one aspect of the subject disclosure, a metamaterial unit cell may exhibit a negative index of refraction (NRI) as well as left-handed triplet material (LHM), and backward traveling waves. The metamaterial unit cell may be realized by a high pass transmission line (TL) structure segment that is overlapped with and formed onto a low pass TL structure segment to form a metamaterial unit cell have a NRI and LHM. In one aspect of the subject disclosure, the metamaterial unit cell is realized by periodically loading a TL with lumped element series capacitors and shunt inductors such that the loading elements dominate the propagation characteristics. In some aspects, such a configuration is simple and compatible with planar microwave circuits. In addition, the negative index of refraction of the TL may not explicitly rely on resonances, and thus can cover a wide bandwidth with low loss. Indeed, NRI TLs may be successfully used in leaky wave antennas. According to various aspects of the subject disclosure, NRI TL metamaterial may be applied to phase shifter devices.

In one aspect of the subject disclosure, a NRI TL enabled compact and tunable phase shifter is provided. The phase shifter may comprise cascaded sections of NRI metamaterial TL and positive refraction index (PRI) TL, which may be referred to herein as a metamaterial unit cell. In some aspects, the phase shifter, for example as compared to common delay line based phase shifters, may be compact in size, may be continuously tunable from negative to positive phases, may have flatter and more linear phase responses over wideband, may have small group delays, and may be compatible for integration to microwave circuits and components.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

Figure 1:
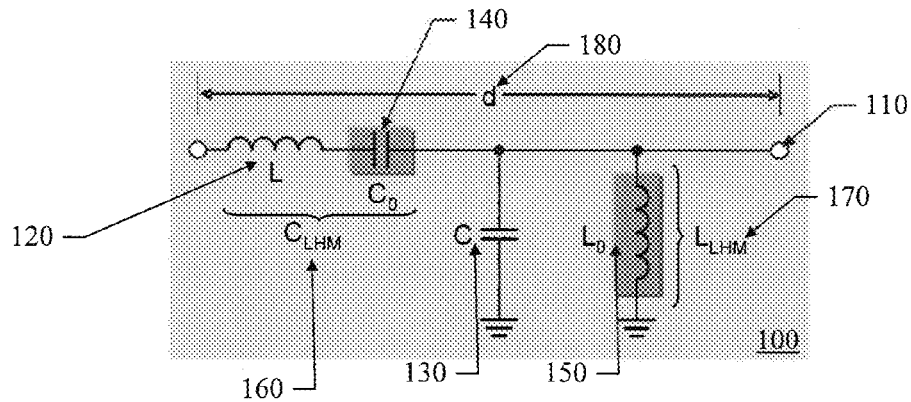
FIG. 1 is a conceptual block diagram illustrating an example of a metamaterial unit cell according to one aspect of the subject disclosure.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

According to various aspects of the subject disclosure, a compact metamaterial enabled tunable wideband phase shifter is provided. In one aspect of the subject technology, a compact and tunable phase shifter is described that is formed using dispersion managed metamaterial transmission line (TL). The phase shifter may include cascaded sections of negative index of refraction (NRI) metamaterial TL and conventional positive refraction index (PRI) TL, with dispersion tuned to wideband operation.

As described herein, a metamaterial unit cell may refer to a transmission line structure that is formed by overlapping and forming a high-pass transmission line structure segment onto a low-pass transmission line structure segment. As further described herein, a metamaterial structure, such as a metamaterial unit cell, may refer a structure that exhibits certain properties that are not found in nature, including, but not limited to, negative refractive index (NRI), left-handed triplet material (LHM), and backward traveling waves. As further described herein, dispersion management may refer to the control of divergent low-pass and high-pass components of a unit cell to provide a phase response that may be tunable over a wide range, yet at a very low loss.

In comparison to phase shifters from other technologies (ferrite, varactor, PIN diode, etc), in one aspect of the subject disclosure, a phase shifter may exhibit the following merits: much more compact in size (<5 mm), continuously tunable from negative to positive phases (−180 to 180 degrees), flatter and linear phase response over wideband, small group delays, and integration compatible to microwave circuits. Phase shifters are the basic building blocks for a suite of microwave/RF components, such as power splitters/combiners, baluns, diplexers, band-pass/band-stop filters. Therefore, the proposed method may also be applied to enable those above-mentioned components with unique properties.

An NRI metamaterial TL may support backward travelling waves, and the phase may lead in the direction of the group velocity. In contrast, a PRI TL may support forward travelling waves, and the phase may lag in the direction of the group velocity. According to certain aspects of the subject disclosure, phase compensation can be achieved if a section of PRI TL is cascaded with a section of NRI TL. In some aspects, a tunable phase shifter can be achieved if the index of the NRI metamaterial is tuned. In one aspect of the subject technology, one PRI transmission line structure segment and one NRI line structure segment may be defined as a unit cell; thus, a series of unit cells may be cascaded to form multi-stage tunable phase shifters. The tuning of the NRI metamaterial may be achieved through a varactor or a tunable inductor.

FIG. 1 shows a phase shifter unit cell 100, according to one aspect of the subject disclosure. $C_0$ 140 and $L_0$ 150 are the loaded series capacitor 140 and shunt inductor 150 to host TL 110 to form a NRI TL (140, 150). C 130 and L 120 may represent equivalent lumped shunt capacitor 130 and series inductor 120 intrinsic to host TL 110 (unit cell 100), which may be referred to as the PRI TL (120, 130). As shown in FIG. 1, without being bound by theory, the following is a theoretical analysis to validate unit cell 100, according to one aspect of the subject disclosure. The dispersion characteristics of the structure in FIG. 1 may be determined by periodic analysis technique:

$$\cos(\beta_{Bloch} d) = \cos(\beta_{TL} d)\left(1 - \frac{1}{4\omega^2 L_0 C_0}\right) + \sin(\beta_{TL} d)\left(\frac{1}{2\omega C_0 Z_0} + \frac{Z_0}{2\omega L_0}\right) - \frac{1}{4\omega^2 L_0 C_0} \quad (1)$$

where $\beta_{Bloch}$ is the Bloch propagation constant and $\beta_{TL} = \omega\sqrt{LC}$ is the propagation constant of the host TL. The physical length d of the unit cell is shorter than a wavelength for the loading element to dominate the propagation property and the cascaded series of unit cells to function as an effective periodic medium according to one aspect of the subject disclosure. We can then set $\beta_{Bloch} d \leq 1$ and $\beta_{TL} d \leq 1$, the effective propagation constant can then be solved from eqn. 1 by retaining first two terms of the Taylor's series for trigonometric functions:

$$\beta_{eff} \approx \omega \sqrt{\left(L - \frac{1}{\omega^2 C_0 d}\right)\left(C - \frac{1}{\omega^2 L_0 d}\right)} \quad (2)$$

Figure 2:
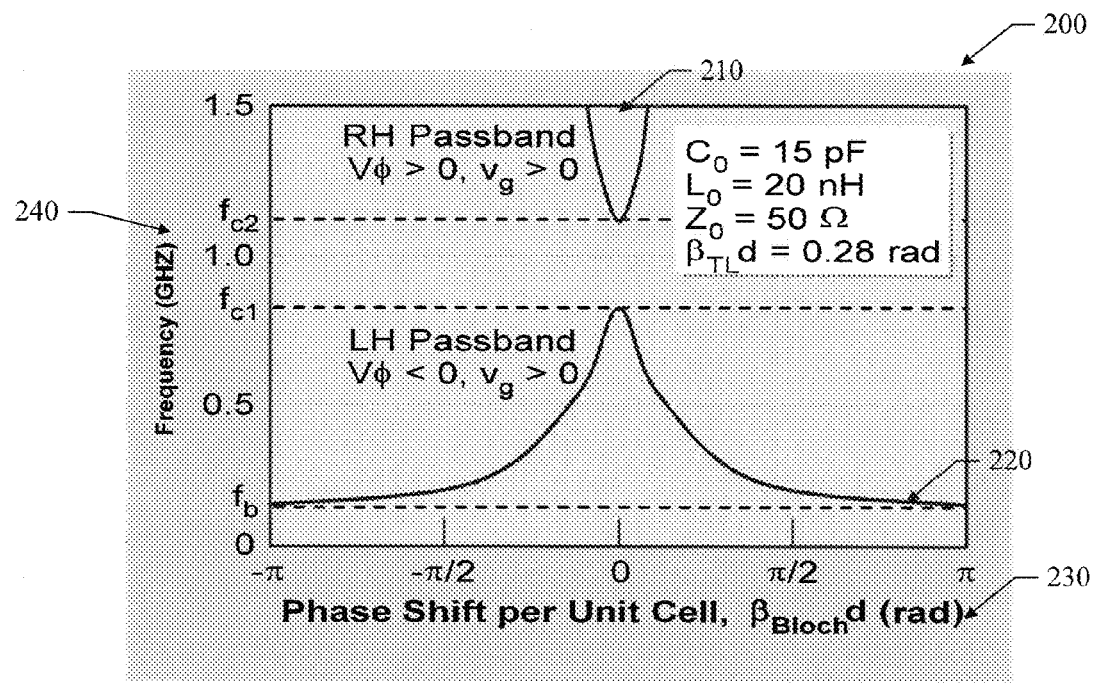
FIG. 2 is a diagram illustrating an example of a band-gap in the metamaterial unit cell of FIG. 1, showing both left-hand and right-hand pass bands according to one aspect of the subject disclosure.

FIG. 2 is a diagram illustrating an example of a band-gap in the metamaterial unit cell of FIG. 1, showing both left-hand 220 and right-hand 210 pass bands according to one aspect of the subject disclosure. FIG. 2 shows the dispersion relation for a unit cell with typical parameters $C_0=15$ pF, $L_0=20$ nH, $Z_0=50\Omega$ and $\beta_{TL} d=0.28$ rad according to one aspect of the subject disclosure. Representatively, dispersion diagram 200 exhibits a band structure with two distinct passbands and stopbands, in phase shift per unit cell 230 vs. frequency (GHz) 240 diagram 200. The Bragg frequency $f_b$ and the stop band limits $f_{c1}$, $f_{c2}$ are given by:

$$f_b = \frac{1}{4\pi\sqrt{L_0 C_0}}, \quad f_{c1} = \frac{1}{2\pi\sqrt{LC_0}}, \quad f_{c2} = \frac{1}{2\pi\sqrt{L_0 C}}$$

To close the stop bands and make continuous passbands, we need to set $f_{c1} = a f_{c2}$, where is a is the dispersion overlap factor. In the scenario where a=1, passbands become continuous but non-degenerative. When a is greater than 1, passbands 210/220 become continuous but degenerate. When a is less than 1, passbands 210/220 are discontinuous and separated by a stopband.

$$\sqrt{\frac{L_0}{C_0}} = a\sqrt{\frac{L}{C}} \quad (3)$$

Substitute eqn. 3 into eqn. 2, the effective propagation constant becomes:

$$\beta_{eff} \approx \omega\sqrt{LC} + \frac{-a}{\omega\sqrt{L_0 C_0}\, d}$$

The total phase shift $\phi_0$ may be written as $$\varphi_0 = \beta_{eff} d \approx \omega\sqrt{LC}\, d + \frac{-a}{\omega\sqrt{L_0 C_0}} = \varphi_{TL} + \frac{-a}{\omega\sqrt{L_0 C_0}} \quad (4)$$

where $\phi_{TL} = \beta_{TL} = \omega\sqrt{LC}d$ is the intrinsic phase shift of the host TL 110 (FIG. 1).

Referring again to FIG. 1, in one aspect of the subject disclosure, the total phase shift is the weighted sum of the phase of the host PRI TL (120, 130) and periodically loaded NRI TL (140, 150). From equation (4), we see that the phase shift from the NRI TL (140, 150) may be independent of the TL 110 length d 180. In one aspect of the subject disclosure, a varactor may replace series capacitor $C_0$ 140, or a tunable CMOS inductor may replace shunt inductor 150, such that the phase shift of the NRI TL (140, 150) may be tuned continuously while retaining the same compact footprint. In combination with the host PRI TL (120, 130), the total phase shift may be tuned over a wide range from negative phase to positive phase. By contrast, conventional phase shifters are generally limited only to positive phase shifts. Representatively, the phase shift from the NRI TL (140, 150) has 1/ω dependency which implies flatter frequency dependency near the center frequency.

The phase response may be a function of the loading elements and the dispersion overlap factor. Tunable range may be expanded if a is optimized. Impedance mismatch however, may result if a is too large, thereby causing the device to become very lossy. In one aspect of the subject disclosure, a compromised optimal dispersion map is designed to enable a tuning range (~360°) over a broadband while keeping the device loss very low.

Figure 3:
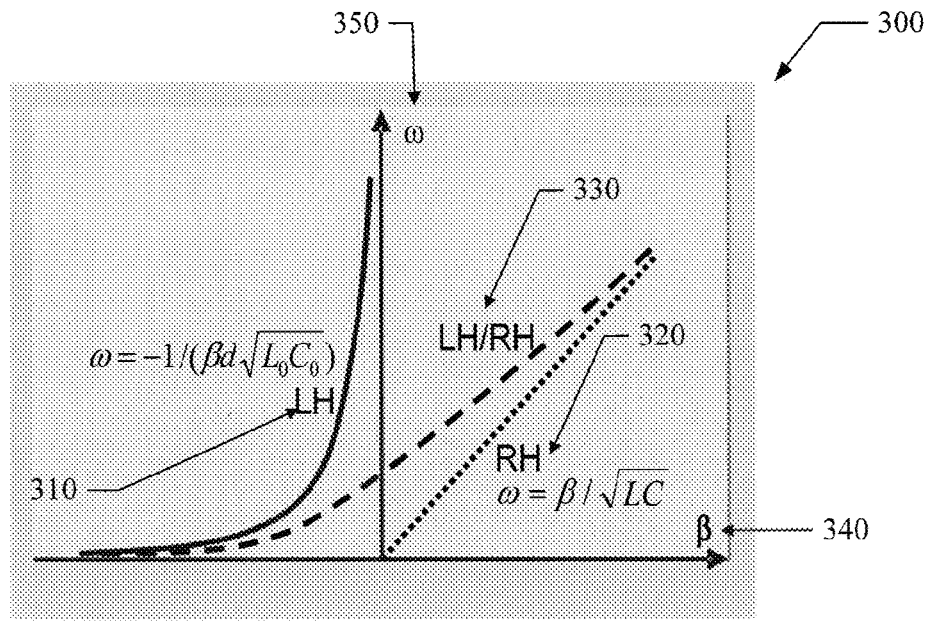
FIG. 3 is a diagram illustrating an example of a dispersion managed metamaterial showing left-hand behavior with a large tuning range.

FIG. 3 is a diagram 300 of β 340 vs. ω 350, illustrating an example of a dispersion managed metamaterial showing left-hand behavior with a large tuning range. FIG. 3 illustrates the relation among total phase response 330 of the unit cell, the phase contribution from RH host TL alone 320, and the phase contribution from LH loaded TL alone 310. Representatively, at low frequencies, LH TL dispersion characteristics 310 dominate; at high frequencies, RH TL dispersion characteristics 320 dominate; at intermediate frequency ranges, the dispersion is determined by weighted sum of both LH and RH TLs 330. The tuning range may depend on the shape and position of the total phase curve. As described below, simulations are described that optimize the dispersion of the unit cell and realize a wideband tunable phase response with large tuning range and low loss.

Based on the theoretical formulations presented above, simulations of unit cell 100 in FIG. 1 may be performed using commercially available simulation software such as, for example, Agilent Advanced Design System (ADS) 2009 microwave simulator. In one aspect of the subject disclosure, a microstrip TL is designed with the following parameters: impedance $Z_0=50\Omega$, $\in_r=4.2$, TL height from the ground plane h=60 mils, length=5 mm, initial $C_0=90$ pF, initial $L_0=200$ nH. Simulations of insertion loss, phase, impedance mismatch, VSWR, and phase shift as a function of frequency may be performed. In one aspect of the subject disclosure, wideband tunability with low insertion loss, may be achieved by optimizing the structure such that the dispersion overlapping factor at 1.28, and the insertion loss at 0.8 dB per unit cell.

Figure 4:
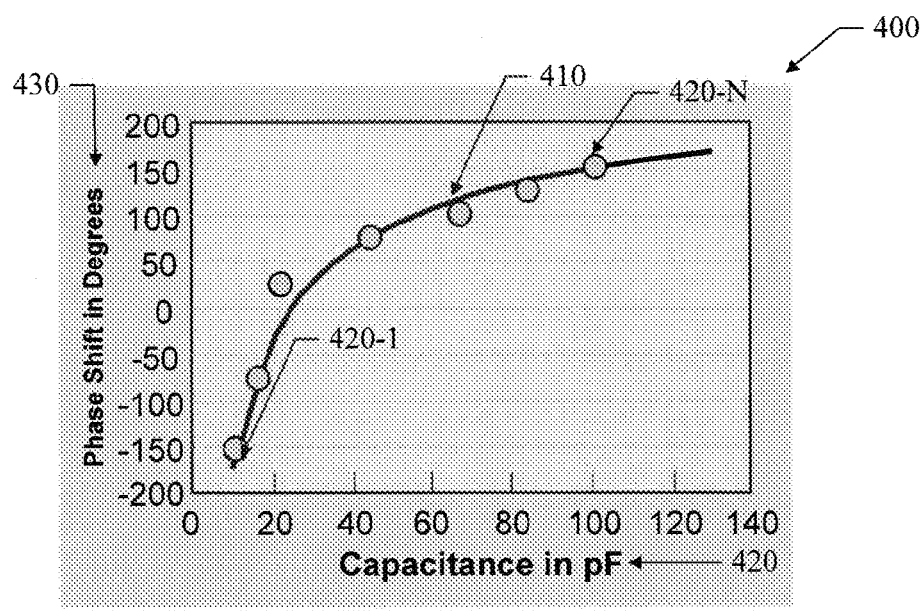
FIG. 4 is a diagram illustrating an example of a dispersion managed phase shifter exhibiting a phase tuning from −180° to 180°.

FIG. 4 is a diagram 400 of capacitance 420 vs. phase shift 430, illustrating an example of a dispersion managed phase shifter exhibiting a phase tuning from −180° to 180° according to one aspect of the subject disclosure. FIG. 4 shows a simulated tuning curve 410 of a one-unit-cell designed at center frequency of 1 GHz in comparison to the experimental data obtained from an actual fabricated device. The smooth line 410 denotes the simulated tuning curve and the dots 420 (420-1, . . . , 420-N) may denote the experimental data. Representatively, excellent agreement was achieved between simulation and experimental data. In one aspect of the subject disclosure, a phase tuning from −180° to +180° (360° total) may be achieved by tuning the series varactor from 10 pF to 130 pF. In comparison, the tuning range was reduced to 140° if the dispersion overlapping factor was designed to be 1.

Figure 5:
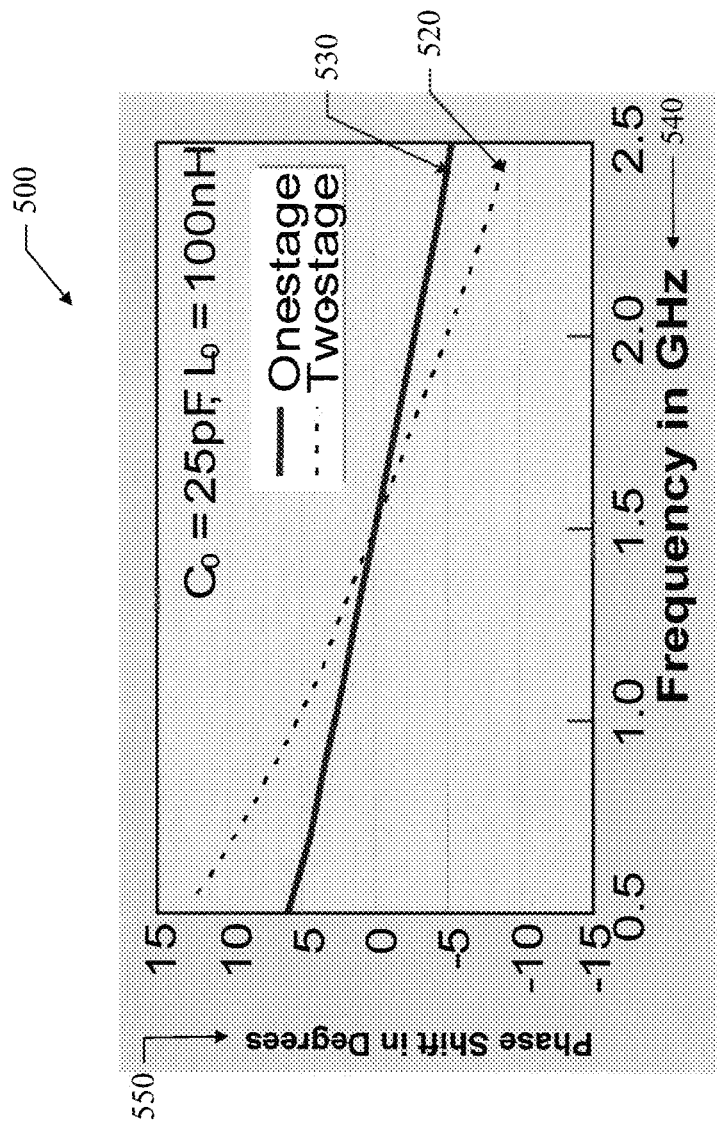
FIG. 5 is a diagram illustrating an example of a dispersion managed phase shifter showing linearity over frequency for one-stage and two stage designs.

FIG. 5 is a diagram 500 of frequency 540 vs. phase shift 550, illustrating an example of a dispersion managed phase shifter showing linearity over frequency for one-stage 530 and two-stage 520 designs according to one aspect of the subject disclosure. FIG. 5 shows the simulated phase shift as a function of frequency for one-stage 530 and two-stage 520 configurations. The phase shifter was centered at 1.5 GHz with 0 degree phase shift. As shown in FIG. 5, a nearly flat and linear dependency on frequency over 2 GHz bandwidth was achieved for both single-stage and two-stage configurations. The linearity implies small group delay for the devices. For two-stage configuration (see FIG. 6), it is self-evident that the frequency dependency is nearly twice as pronounced as that for the single-stage configuration. For flatter response over even wider bandwidth, further optimization in dispersion band overlap may be required. Depending on the application, a single-stage configuration may be more suitable when flat phase response over frequency is desirable; whereas multi-stage configuration is more suitable when larger phase shift is more desirable. It should be pointed out that the lumped element capacitors/varactors and inductors can be very small footprint components, so a phase shifter may be more compact than the one used in the simulation which is 5 mm in length per unit cell according to one aspect of the subject disclosure.

Figure 6:
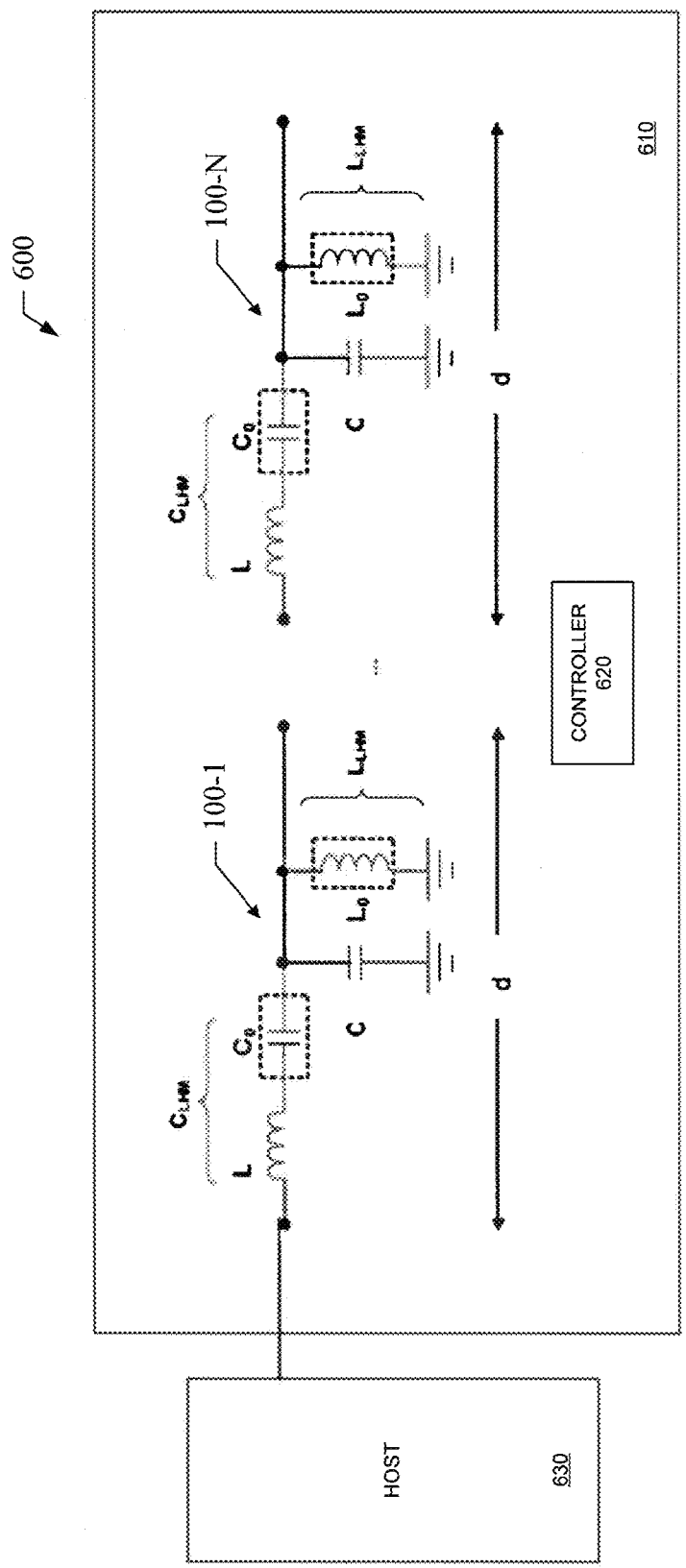
FIG. 6 is a conceptual block diagram illustrating an example of multi-stage phase shifter according to one aspect of the subject disclosure.

FIG. 6 is a conceptual block diagram illustrating an example of a system 600 including a multi-stage phase shifter 610 according to one aspect of the subject disclosure. Representatively, multi-stage phase shifter 610 is coupled to host 630, and may include may include a plurality of unit cells 100 (100-1, . . . , 100-N), configured, for example, as described with reference to FIG. 1. In one aspect, multi-stage phase shifter 610 may include a controller 620 that is configured to adjust an index of the NRI of each unit cell 100 to provide a predetermined phase tuning range.

In one aspect of the subject disclosure, operation of system 600 may include setting design target parameters including, but not limited to, an operating frequency range and a phase tuning range. Once selected, corresponding parasitics (L 120 and C 130) associated with the host TL may be derived, as well as the selection of a dielectric material for printed circuit board (PCB) fabrication. Next, loading element parameters ($L_0$ 150 and $C_0$ 140) are derived based on analytical solutions given by equations (2)-(4) using, for example, an optimized overlap factor a in the range of 1 to 1.28. Further optimization may be performed by fine tuning overlap factor a around 1.28. Optional numerical validation may be performed using commercial available simulation software including, but not limited to, Agilent ADS, Ansoft HFSS, or the like. Layout generation is next performed using commercially available layout tools including, but not limited to, Cadence, Agilent ADS, or the like. Finally, PCB fabrication may be performed using Gerber files derived from the selected layout tool.

The dispersion managed metamaterial TL may be implemented on conventional printed circuit boards (PCB) using standard processes at very low cost. The implementation may, be in the form of microstrip, stripline, or coplanar waveguide (CPW) on multi-layer or single layer PCBs. Multi-layer 3D implementation may allow further miniaturization, although it may require more processing steps. The choice of the PCB dielectric material may depend on the component performance requirements as well as operating environments. For example, LCP (liquid crystal polymer) is known to have very low moisture absorption, thus it may be ideal for hermetic packaging. In one aspect of the subject disclosure, the loading lumped elements (varactors and inductors), they can be implemented either as surface-mount chips or as integrated forms such as inter-digital capacitors and spiral/shorted-stub inductors. Even greater miniaturization may be achieved through a monolithic integration process, where the proposed metamaterial can be monolithically integrated onto GaAs or SiGe IC platform.

TABLE 1 illustrates a comparison between a proposed phase shifter and state-of-the-art conventional phase shifter:

| Phase shifters | Insertion loss (dB) | Return loss (dB) | Control Voltage Range (V) | Tunable Phase Range (degrees) | Frequency Range (GHz) | Linearity R2 (phase versus freq) | IP3 (dBm) | Size |
|---|---|---|---|---|---|---|---|---|
| Conventional TL | 3 | 15 | N/A | N/A | 1-15 | 1 | 34 | Large |
| Varactor MMIC (Hittite HMC538LP4) | 6 | 7 | 10 | 0 to 300 | 6-15 | 0.2 | 15 | very small |
| PIN diode | 4 | 15 | 10 | N/A | 1-15 | 1 | 30 | small |
| Ferrite | 2 | 15 | 100 | 0 to 120 | 10-14 | 0.4 | 36 | Large |
| Metamaterial TL | 1 | 13 | 10 | −100 to 300 | 1-15 | 0.87 | 32 | very small |

In some approaches, phase shifters are based on PIN diodes, varactor diodes, or mechanical delay lines. A PIN diode may be a semiconductor device that operates as a variable impedance circuit as the bias current changes. PIN diodes may generate minimal signal distortion, which is known as inter-modulation and non-linear distortion. PIN diodes however may have limited response bandwidths. Thus, PIN diodes may be suitable for use in applications where slower switching speed can be tolerated. Mechanical delay lines may be a form of phase shifters and may be distortion free, but can be bulky in size and slow in tuning. A varactor diode may be a semiconductor device (such as a reverse biased P-N junction) that operates as a variable capacitor as the bias voltage changes. With a variable voltage across this diode, the capacitance of the diode may change and thus can cause the reflected power to change phases. Due to the finite Q of varactor, diodes, the signal integrity may undergo slight changes in amplitude and phase as the voltage is varied. Hyper-abrupt varactor diodes may have a relatively linear response to voltage and may be commonly used semiconductors in analog phase shifters.

Aspects of the subject technology utilize unique properties of matured metamaterial structures to realize a compact tunable wideband phase shifter. The phase shifter may exhibit wide-range tunability, flatter frequency responses, linearity, small group delays, and integration compatibility with planar microwave circuits. In some aspects, the subject technology may be applied in radio communication, wireless communication, and electronics. In some aspects, the subject technology may be applied in phased antenna arrays, for example, in military radars.

In accordance with various aspects of the subject disclosure, the subject technology is related to phase shifters and phased arrays. In some aspects, the subject technology may be used in various markets, including for example and without limitation, data and transmission markets, and radar and active phased array markets.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such an embodiment may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A metamaterial unit cell, comprising:
   a first transmission line segment; and
   a second transmission line segment overlapped with and formed onto the first transmission line segment to form the metamaterial unit cell having a negative refractive index (NRI),
   wherein the NRI of the metamaterial unit cell is adjustable through dispersion management based on a predetermined dispersion overlap factor associated with the metamaterial unit cell to provide a wide phase tuning range over non-resonance and resonance frequencies.

2. The metamaterial unit cell of claim 1, wherein the wide phase tuning range comprises at least three hundred sixty degrees.

3. The metamaterial unit cell of claim 1, wherein the first transmission line segment comprises:
   a low-pass transmission line structure.

4. The metamaterial unit cell of claim 3, wherein the second transmission line segment comprises:
   a high-pass transmission line structure.

5. The metamaterial unit cell of claim 4, wherein the high-pass transmission line structure comprises one of a series varactor and a shunt inductor that is adjustable to enable a phase response of the unit cell of up to at least three-hundred sixty degrees.

6. The metamaterial unit cell of claim 5, wherein a phase response of the unit cell is a function of one or more loading elements of the high-pass transmission line structure and a dispersion overlap factor between the high-pass transmission line structure and the low-pass transmission line structure.

7. The metamaterial unit cell of claim 5, wherein a length of the unit cell is less than five millimeters.

8. An apparatus comprising:
   a low pass transmission line structure segment;
   a high-pass transmission line structure segment overlapped with and formed onto the low pass transmission line structure segment to form a metamaterial unit cell having a negative refractive index (NRI),
   wherein the NRI of the metamaterial unit cell is adjustable through dispersion management based on a predetermined dispersion overlap factor associated with the metamaterial unit cell to provide a wide phase tuning range over non-resonance and resonance frequencies.

9. The apparatus of claim 8, wherein the high-pass transmission line structure segment comprises one of a series varactor and a shunt inductor that is adjustable to enable a phase response of the unit cell up to at least three-hundred sixty degrees.

10. The apparatus of claim 9, further comprising:
    a controller operable to adjust one of the varactor and the shunt inductor.

11. The apparatus of claim 8, wherein the apparatus comprises a phase shifter.

12. The apparatus of claim 11, wherein a phase response of the phase shifter is a function of one or more loading elements of the high-pass transmission line structure segment and a dispersion overlap factor between the high-pass transmission line structure segment and the low-pass transmission line structure segment.

13. The apparatus of claim 8, wherein the high-pass transmission line structure segment comprises load element parameters ($L_0$ and $C_0$), which are determined according to a predetermined dispersion overlap factor a.

14. The apparatus of claim 8, wherein a size of the phase shifter is less than five millimeters.

15. A system comprising:
    one or more metamaterial unit cells, comprising:
        a low pass transmission line structure segment, and
        a high-pass transmission line structure segment overlapped with and formed onto the low pass transmission line structure segment to form a metamaterial unit cell having a negative refractive index (NRI); and
    a controller operable to adjust an index of the NRI of each of the metamaterial unit cells, through dispersion management based on a predetermined dispersion overlap factor, to provide a wide phase tuning range over non-resonance and resonance frequencies.

16. The system of claim 15, wherein the high-pass transmission line structure segment comprises one of a series varactor and a shunt inductor that is adjustable, according to the controller, to enable a phase response of the unit cells up to at least three-hundred sixty degrees.

17. The system of claim 15, wherein the high-pass transmission line structure segment comprises load element parameters ($L_0$ and $C_0$), which are determined according to a predetermined dispersion overlap factor a.

18. The system of claim 17, wherein the predetermined dispersion overlap factor is in the range of 1 to 1.28.

19. The system of claim 15, wherein the system comprises a multi-stage phase shifter.

20. The system of claim 15, wherein the system comprises one of microstrip transmission lines, stripline transmission lines, and coplanar waveguides.

\* \* \* \* \*